United States Patent
Huang

(10) Patent No.: US 12,431,840 B2
(45) Date of Patent: Sep. 30, 2025

(54) SOLAR MODULE AND METHOD FOR FABRICATING THE SAME

(71) Applicant: HELIARTEC SOLUTIONS CORPORATION, LTD., Zhubei (TW)

(72) Inventor: Ting-Hui Huang, Zhubei (TW)

(73) Assignee: Heliartec Solutions Corporation, LTD., Zhubei (TW)

( * ) Notice: Subject to any disclaimer, the term of this patent is extended or adjusted under 35 U.S.C. 154(b) by 0 days.

(21) Appl. No.: 15/791,964

(22) Filed: Oct. 24, 2017

(65) Prior Publication Data
US 2019/0028057 A1 Jan. 24, 2019

(30) Foreign Application Priority Data
Jul. 21, 2017 (TW) .................. 106124532

(51) Int. Cl.
*H02S 40/34* (2014.01)
*H02S 20/22* (2014.01)
*H10F 19/00* (2025.01)
*H10F 19/70* (2025.01)
(Continued)

(52) U.S. Cl.
CPC .............. *H02S 40/34* (2014.12); *H02S 20/22* (2014.12); *H10F 19/00* (2025.01); *H10F 19/70* (2025.01); *H10F 19/902* (2025.01); *H10F 71/00* (2025.01); *H10F 71/137* (2025.01)

(58) Field of Classification Search
CPC ....... H02S 40/34; H02S 20/22; H01L 31/044; H01L 31/042; H01L 31/0504; H01L 31/18; H01L 31/1876
See application file for complete search history.

(56) References Cited

U.S. PATENT DOCUMENTS

| | | | |
|---|---|---|---|
| 2008/0223429 A1* | 9/2008 | Everett | H01L 24/80 136/244 |
| 2015/0194551 A1* | 7/2015 | Crist | H01L 31/0508 136/244 |

(Continued)

FOREIGN PATENT DOCUMENTS

| | | |
|---|---|---|
| CN | 104282802 A | 1/2015 |
| JP | 2003-078155 A | 3/2003 |
| JP | 2012-094751 A | 5/2012 |

(Continued)

OTHER PUBLICATIONS

Machine translation of JP-2015005605-A (Year: 2015).*

(Continued)

*Primary Examiner* — Tamir Ayad
(74) *Attorney, Agent, or Firm* — Lee & Hayes, P.C.; James M. Behmke

(57) ABSTRACT

The present disclosure provides a solar module and a method for fabricating the same. A primary solar cell is cut in a longitudinal direction to form a plurality of half-cut solar cells. Each of the half-cut solar cells includes a first electrode side and a second electrode side opposing the first electrode. The width of the first electrode side of each of the half-cut solar cells is less than a distance between the first electrode side and the second electrode side. The half-cut solar cells are arranged in series and in line with the installation of bypass diodes, thereby preventing the solar module from catching fire due to partial shading.

6 Claims, 3 Drawing Sheets

(51) Int. Cl.
    *H10F 19/90*       (2025.01)
    *H10F 71/00*       (2025.01)

(56) References Cited

U.S. PATENT DOCUMENTS

2015/0349703 A1 * 12/2015 Morad .................... H01L 31/05
                                                                                                         136/251
2016/0284909 A1    9/2016 Harley et al.

FOREIGN PATENT DOCUMENTS

| | | | | |
|---|---|---|---|---|
| JP | 2015005605 A | * | 1/2015 | ........... H01L 31/042 |
| JP | 2016-527857 A | | 9/2016 | |
| TW | 201601336 A | | 1/2016 | |
| TW | 201611317 A | | 3/2016 | |
| TW | M542250 U | | 5/2017 | |
| WO | 2012/043770 A1 | | 4/2012 | |

OTHER PUBLICATIONS

Japanese Office Action issued in connection with Japanese application No. 2017-193758 on Sep. 3, 2018.
Taiwanese Office Action Issued in Connection with Corresponding TW Application No. 106124532 on Nov. 15, 2017.

* cited by examiner

SOLAR MODULE AND METHOD FOR FABRICATING THE SAME

RELATED APPLICATION

This application claims the benefit of Taiwanese Patent Application No. 106124532, filed on Jul. 21, 2017, the entire content of which is incorporated herein.

BACKGROUND

1. Technical Field

The present disclosure relates to solar cells, and, more particularly, to a solar module and a method for fabricating the same.

2. Description of Related Art

A standard solar module in the form of a panel typically consists of 60 units of solar cells (for example, with 10 units of solar cells connected in series into a string and a total of 6 strings) or 72 units of solar cells (for example, with 12 units of solar cells connected in series into a string and a total of 6 strings), and a bypass diode is bridged between every two strings, such that a current can be guided through the bypass diodes in order to prevent overheating of the solar module due to partial shading or any abnormality in the solar cell strings.

With the increase in demand for electricity, half-cut silicon solar cells such as those described in TW Patent No. M542250 have been developed in order to increase the overall power of the solar modules without increasing the cost of materials.

TW Patent No. M542250 proposed a solar module 1, such as one shown in FIG. 1, in which a single primary solar cell 1a is cut in the lateral direction (perpendicular to the direction of strings) into two half-cut solar cells 10. Each of the half-cut solar cells 10 has a first electrode side 10a and a second electrode side 10b opposite to each other, and the width r of the first electrode side 10a is greater than the distance h between the first electrode side 10a and the second electrode side 10b. Thereafter, the plurality of half-cut solar cells 10 are arranged in series on two regions 121 and 122 of a glass substrate 12 via a wire 100. A plurality of bypass diodes 11 are arranged between the two regions 121 and 122 to electrically connect the half-cut solar cells 10 in these two regions 121 and 122. By ensuring the direction of cutting is perpendicular to the lengthwise direction of the module, the impedance of each of the half-cut solar cells 10 when connected in series can be reduced, thereby raising the overall power of the solar module 1 by 1% to 2% without increasing the cost of materials.

However, in the conventional solar module 1, lateral cutting changes its length to width ratio, resulting in the width (e.g., 600 mm or 900 mm) being smaller than the width (e.g., 992 to 997 mm) of a standard solar module, or that the size of the solar module is not sufficient to accommodate even numbers of solar cell strings. As a result, the bypass diodes 11 cannot be provided as in the conventional standard module (e.g., bridged between two solar cell strings), and the bypass diodes 11 are instead arranged between the two regions 121 and 122 (or inserted between two half-cut solar cells 10). As a result, the solar module 1 becomes more susceptible to overheating due to partial shading, and may be at the risk of catching fire. Therefore, the conventional solar module 1 fails to satisfy the safety requirements (overheating resistant) for solar panels used on buildings.

Therefore, there is a need for a solution that addresses the aforementioned issues in the prior art.

SUMMARY

In view of the aforementioned shortcomings of the prior art, the present disclosure provides a method for fabricating a solar module, which may include: cutting a primary solar cell into a plurality of half-cut solar cells, wherein each of the half-cut solar cells includes a first electrode side and a second electrode side opposing the first electrode side, with a width of the first electrode side being less than a distance between the first electrode side and the second electrode side; and connecting the half-cut solar cells in series to at least one bypass diode in such a way that the first electrode side of one of the half-cut solar cells is connected to the second electrode side of an adjacent one of the half-cut solar cells.

The present disclosure further provides a solar module, which may include: a plurality of half-cut solar cells, each of which includes a first electrode side and a second electrode side opposing the first electrode side, with a width of the first electrode side being less than a distance between the first electrode side and the second electrode side, wherein the first electrode side of one of the half-cut solar cells is connected with the second electrode side of an adjacent one of the half-cut solar cells; and at least one bypass diode electrically connected with the half-cut solar cells connected in series.

In an embodiment, the solar module is rectangular and has a length at least two times greater than its width.

In an embodiment, an even number of groups of the half-cut solar cells are connected in series.

In an embodiment, each of the half-cut solar cells includes a conductive material electrically connected to the first electrode side and the second electrode side, and disposed in a direction parallel to a cutting direction along which the primary solar cell is cut.

In an embodiment, a carrier is further provided, which may include a receiving area for the half-cut solar cells to be placed therewithin, and the bypass diode is disposed on a periphery of the receiving area.

It can be understood from the above that the solar module and the method for fabricating the same according the present disclosure essentially cut a primary solar cell in a longitudinal direction to obtain a plurality of half-cut solar cells, such that the width of the first electrode side of each of the half-cut solar cells is less than the distance between the first electrode side and the second electrode side, and then connects the half-cut solar cells together in series, followed by connecting a bypass diode in series to the plurality of half-cut solar cells, thereby preventing the solar module from catching fire due to partial shading. Therefore, compared to the solar modules of the prior art, the solar modules according to the present disclosure is able to meet the safety requirements (overheating resistant) of solar panels used on buildings.

DETAILED DESCRIPTION OF THE EMBODIMENTS

Figure 1:
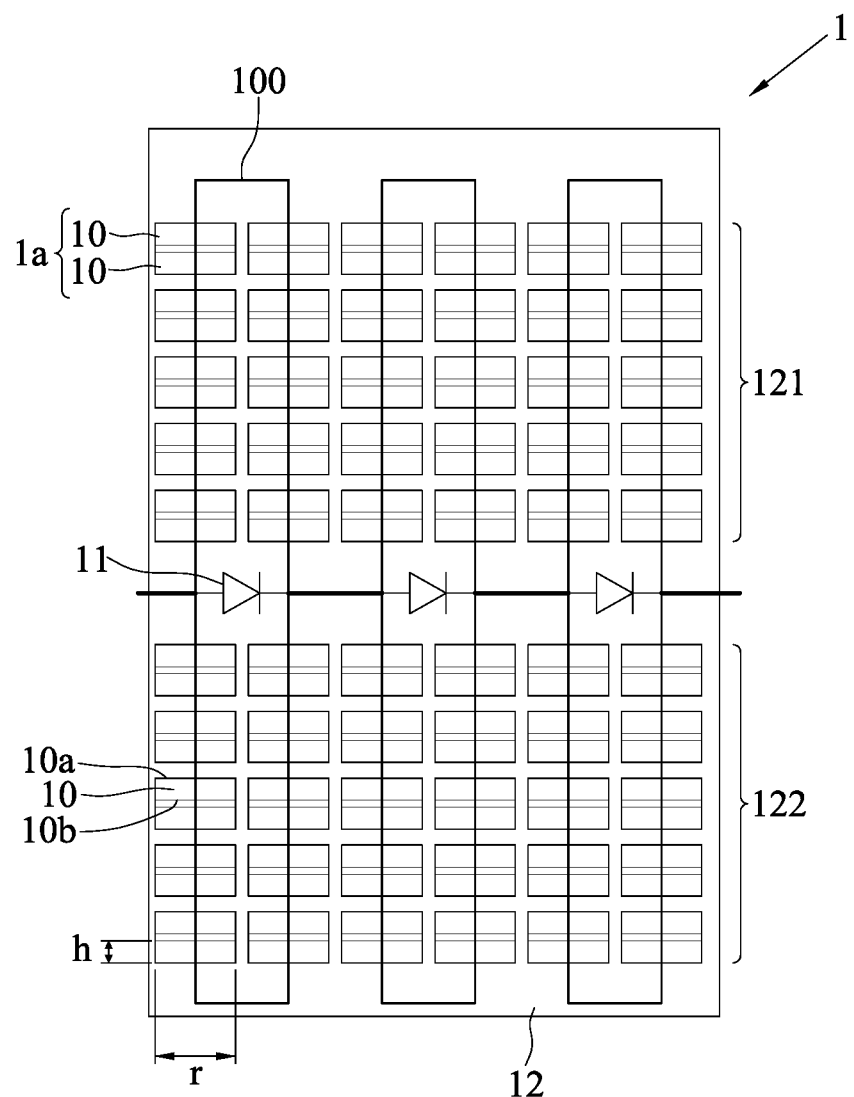
FIG. 1 is a planar schematic diagram depicting a conventional solar module.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
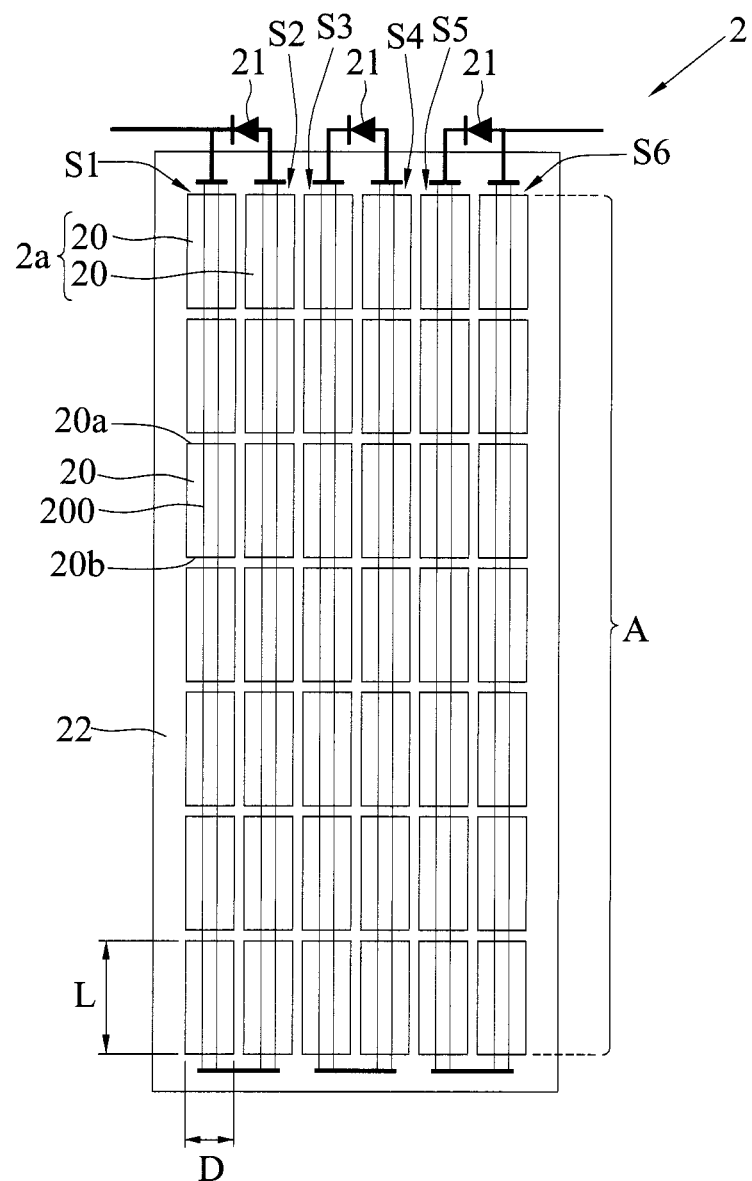
FIG. 2 is a planar schematic diagram depicting a solar module and a method for fabricating the same according to the present disclosure.
Figure 3A:
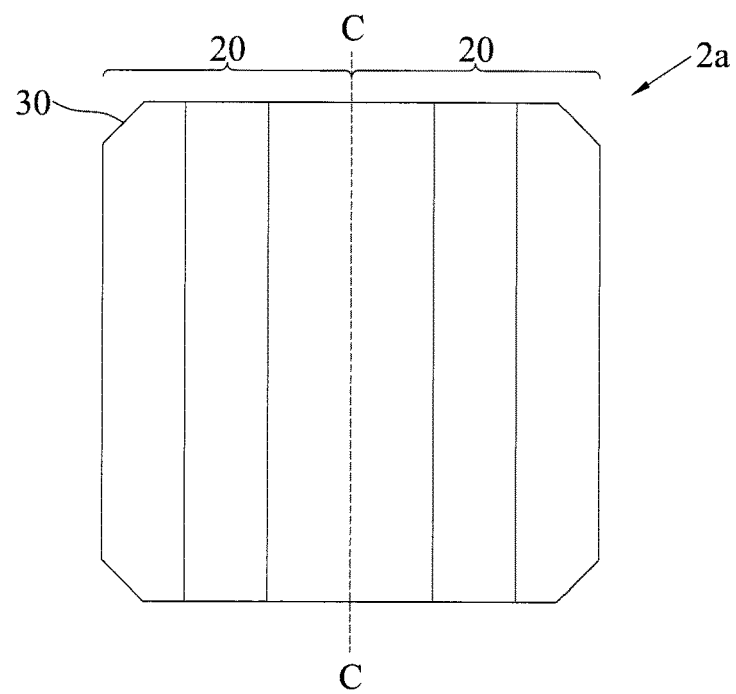
FIGS. 3A and 3B are planar schematic diagrams illustrating different implementations for forming a half-cut solar cell in the method for fabricating a solar module in accordance with the present disclosure.
Figure 3B:
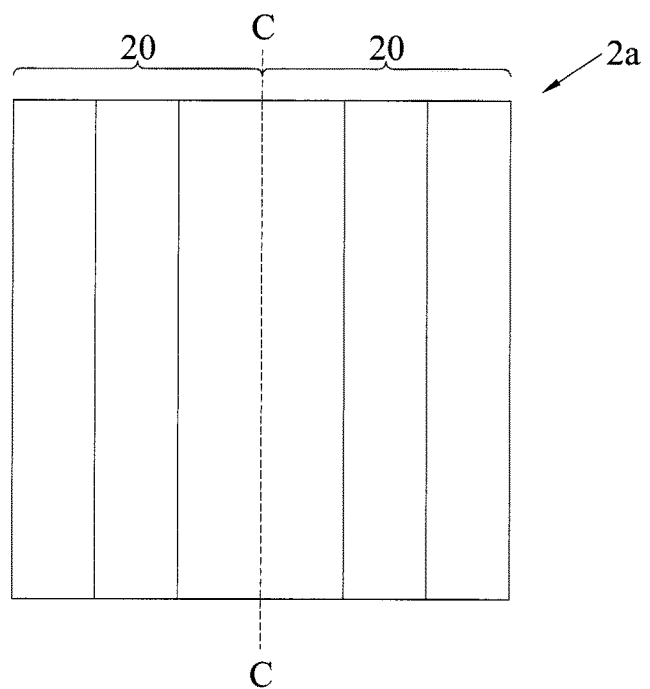

FIG. 2 is a planar schematic diagram depicting a solar module in accordance with the present disclosure. FIGS. 3A and 3B are planar schematic diagrams illustrating different implementations for forming a half-cut solar cell in a method for fabricating a solar module in accordance with of the present disclosure.

As shown in FIG. 3A or 3B, a single primary solar cell 2a is cut along a vertical cutting line C to form two half-cut solar cells 20. The primary solar cell 2a has chamfers 30 (as shown in FIG. 3A) or has no chamfers (as shown in FIG. 3B). Furthermore, as shown in FIG. 2, each of the half-cut solar cells 20 has a first electrode side 20a and a second electrode side 20b opposing the first electrode side 20a. The width D (i.e., the short side) of the first electrode side 20a is less than the distance L (i.e., the long side) between the first electrode side 20a and the second electrode side 20b. Similarly, since the width D of the first electrode side 20a is equal to the width D of the second electrode side 20b, the width D of the second electrode side 20b is less than the distance L between the first electrode side 20a and the second electrode side 20b.

In an embodiment, each of the half-cut solar cells 20 includes a conductive material (e.g., a conductive paste) electrically connected to the first electrode side 20a and the second electrode side 20b.

Thereafter, the plurality of half-cut solar cells 20 are connected in series in such a way that the first electrode side 20a of one of the half-cut solar cells 20 is connected to the second electrode side 20b of an adjacent one of the half-cut solar cells 20, and are electrically connected to at least one bypass diode 21, thereby completing the fabrication of a solar module 2.

In an embodiment, the solar module 2 is in the shape of a panel, and the half-cut solar cells 20 are arranged in arrays, so that the solar module 2 is rectangular with a length to width ratio greater than or equal to 2 (i.e., ≥2). Compared to a conventional solar module 1 (shown in FIG. 1) where the length to width ratio is less than 2, the solar panel according to the present disclosure has its length to width ratio Z 2, which makes the solar module 2 suitable for standard or other building materials specification.

Moreover, the half-cut solar cells 20 are connected in series with solder wires 200 (e.g., conductive copper foils) into a plurality of groups S1-S6 of half-cut solar cells 20 connected in series, wherein the number of groups S1-S6 (i.e., the number of arrays) are even, for example, six as in FIG. 2, and a bypass diode 21 is bridged between every two arrays (i.e., two of the groups S1-S6).

Furthermore, a carrier 22 with at least one receiving area A is provided. The receiving area A carries the half-cut solar cells 20, and the bypass diodes 21 are arranged on a periphery of the receiving area A and are not provided between any two half-cut solar cells 20 so as to be compliance with the layout for standard specifications. The carrier 22 can be, for example, a glass sheet or a film. For example, the half-cut solar cells 20 can be laminated between two glass sheets. Alternatively, the half-cut solar cells 20 can be laminated between a back film and a glass lid.

In an embodiment, the lengthwise direction the half-cut solar cells 20, the direction of series connection of the soldering conductive copper foils (e.g., the direction of the electrical connection of the conductive materials between the first electrode side and the second electrode side), and the lengthwise direction of the solar module 2 are all parallel to one another.

It can be appreciated that a frame (not shown) can be further provided on the periphery of the carrier 22 if needed.

Therefore, in the method for fabricating a solar module 2 according to the present disclosure, regardless of whether the primary solar cell 2a has chamfers (as shown in FIG. 3A) or has no chamfers (as shown in FIG. 3B), the primary solar cell 2a is cut in a direction parallel to the coating of the conductive material (conductive paste), such that the width of the first electrode side of each of the half-cut solar cells 20 is less than the distance between the first electrode side and the second electrode side, and then the half-cut solar cells 20 are connected in series into even-numbered arrays to facilitate the provision of bypass diodes 21 on the periphery of the receiving area A, so that there is no need to provide a bypass diode 21 between any two half-cut solar cells 20 in order to be compliant with the layout of the standard specifications.

In conclusion, the solar module 2 and the method for fabricating the same according to the present disclosure allow the bypass diodes 21 to be disposed at more advantageous locations by cutting the primary solar cell 2a in the longitudinal direction to prevent fire from being caused by partial shading of the solar module 2. Therefore, compared to the solar modules of the prior art, the solar module 2 according to the present disclosure meets the safety requirements (overheating resistant) of solar panels used on buildings.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A solar module of a solar panel used on buildings, comprising:
   a plurality of groups, each of which includes a plurality of rectangular half-cut solar cells having a short side as a first electrode side and a second electrode side opposing the first electrode side, with the short side being less than a long side, the long side being a distance between the first electrode side and the second electrode side, wherein in each of the plurality of groups, all of the half-cut solar cells are arranged in a row by the short side and electrically connected in series only with the short side, and all of the half-cut solar cells are free from being electrically connected in series with the long side;
   at least one bypass diode connected with the short sides of the outermost half-cut solar cells in the row and electrically connected with the short sides of the half-cut solar cells; and
   a carrier having two glass sheets, wherein the half-cut solar cells are laminated between the two glass sheets, wherein the solar module is rectangular and has its length at least two times greater than its width,
   wherein the long sides of the half-cut solar cells, a direction of series connection of the half-cut solar cells in each of the groups, and a lengthwise direction of the solar module are all parallel to one another, and
   wherein the plurality of groups are arranged in arrays along the width of the solar module.

2. The solar module of claim 1, wherein the groups are formed in an even number.

3. The solar module of claim 1, wherein each of the half-cut solar cells in each of the groups includes a conductive material electrically connected to the first electrode side and the second electrode side.

4. The solar module of claim 3, wherein the conductive material is disposed in the direction of the series connection.

5. The solar module of claim 1, wherein the carrier includes a receiving area for the half-cut solar cells to be placed therewithin.

6. The solar module of claim 5, wherein the at least one bypass diode is disposed on a periphery of the receiving area.

* * * * *